(12) United States Patent
Kuo et al.

(10) Patent No.: US 11,756,879 B2
(45) Date of Patent: Sep. 12, 2023

(54) SEMICONDUCTOR DEVICES AND METHODS OF MANUFACTURING THE SAME

(71) Applicant: Taiwan Semiconductor Manufacturing Company, Ltd., Hsinchu (TW)

(72) Inventors: Hung-Jui Kuo, Hsinchu (TW); Hui-Jung Tsai, Hsinchu (TW); Keng-Han Lin, Hsinchu (TW); Jyun-Siang Peng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 133 days.

(21) Appl. No.: 17/395,482

(22) Filed: Aug. 6, 2021

(65) Prior Publication Data

US 2021/0366826 A1    Nov. 25, 2021

Related U.S. Application Data

(63) Continuation of application No. 16/398,146, filed on Apr. 29, 2019, now Pat. No. 11,088,068.

(51) Int. Cl.
| | |
|---|---|
| *H01L 23/522* | (2006.01) |
| *H01L 23/528* | (2006.01) |
| *H01L 23/00* | (2006.01) |
| *H01L 23/31* | (2006.01) |
| *H01L 21/56* | (2006.01) |
| *H01L 21/768* | (2006.01) |

(52) U.S. Cl.
CPC ........ *H01L 23/5226* (2013.01); *H01L 21/563* (2013.01); *H01L 21/76802* (2013.01); *H01L 21/76876* (2013.01); *H01L 23/3128* (2013.01); *H01L 23/5283* (2013.01); *H01L 24/09* (2013.01); *H01L 24/17* (2013.01); *H01L 2224/0231* (2013.01); *H01L 2224/02373* (2013.01); *H01L 2224/02379* (2013.01); *H01L 2224/02381* (2013.01); *H01L 2224/0401* (2013.01)

(58) Field of Classification Search
None
See application file for complete search history.

(56) References Cited

U.S. PATENT DOCUMENTS

| | | | | |
|---|---|---|---|---|
| 5,635,423 | A * | 6/1997 | Huang | ................ H01L 21/7681 438/700 |
| 6,429,119 | B1 * | 8/2002 | Chao | ................ H01L 21/76813 438/634 |
| 8,993,380 | B2 | 3/2015 | Hou et al. | |
| 9,281,254 | B2 | 3/2016 | Yu et al. | |

(Continued)

*Primary Examiner* — Evren Seven
(74) *Attorney, Agent, or Firm* — JCIPRNET

(57) ABSTRACT

A semiconductor device includes a die, a plurality of dielectric layers over the die, a via and at least one ring. The dielectric layers include a plurality of first surfaces facing the die. The via penetrates through the plurality of dielectric layers and includes at least one second surface facing the die. The ring surrounds the via and is disposed in at least one of the plurality of dielectric layers. The ring includes a third surface facing the die, wherein the third surface of the at least one ring is inserted between the at least one second surface of the via and the first surface of the at least one of the plurality of dielectric layers.

20 Claims, 19 Drawing Sheets

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,633,917 B2 * | 4/2017 | Tsai | H01L 24/13 |
| 9,666,502 B2 | 5/2017 | Chen et al. | |
| 9,735,131 B2 | 8/2017 | Su et al. | |
| 2015/0348874 A1 * | 12/2015 | Tsai | H01L 21/76898 |
| | | | 257/774 |

* cited by examiner

SEMICONDUCTOR DEVICES AND METHODS OF MANUFACTURING THE SAME

CROSS-REFERENCE TO RELATED APPLICATION

This is a continuation application of and claims the priority benefit of U.S. application Ser. No. 16/398,146, filed on Apr. 29, 2019. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of types of semiconductor packages include quad flat packages (QFP), pin grid array (PGA) packages, ball grid array (BGA) packages, flip chips (FC), three-dimensional integrated circuits (3DICs), wafer level packages (WLPs), and package on package (PoP) devices, etc. Although existing semiconductor packages have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
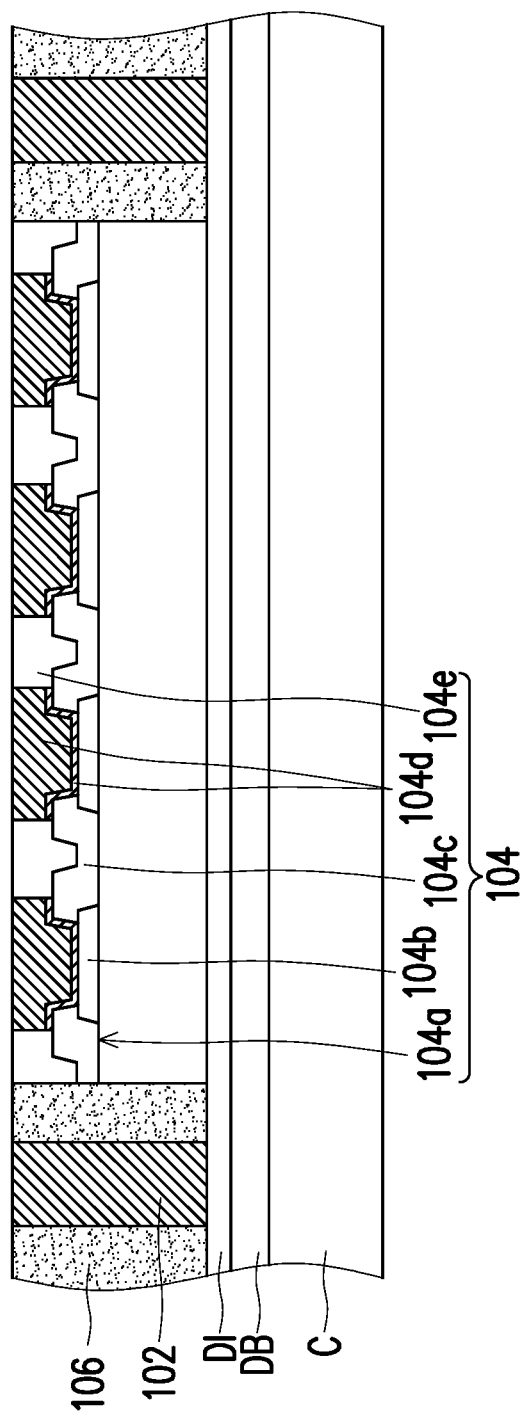
FIGS. 1A-1G are schematic cross-sectional views illustrating a manufacturing process of a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending over the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1G are schematic cross-sectional views illustrating a manufacturing process of a semiconductor package in accordance with some embodiments of the disclosure. Referring to FIG. 1A, a carrier C is provided. A de-bonding layer DB and a dielectric layer DI are stacked over the carrier C in sequential order. In some embodiments, the de-bonding layer DB is formed on the upper surface of the carrier C, and the de-bonding layer DB is between the carrier C and the dielectric layer DI. The carrier C is, for example, a glass substrate. On the other hand, in some embodiments, the de-bonding layer DB is a light-to heat-conversion (LTHC) release layer formed on the glass substrate. In some embodiments, the dielectric layer DI is, for example, polymer such as polyimide, benzocyclobutene (BCB), polybenzoxazole (PBO), or the like. In some alternative embodiments, the dielectric layer DI may include non-organic dielectric materials such as silicon oxide, silicon nitride, silicon carbide, silicon oxynitride, or the like. However, the materials of the de-bonding layer DB, the carrier C, and the dielectric layer DI are merely for illustration, and the disclosure is not limited thereto.

A plurality of pre-fabricated conductive posts 102 and a pre-fabricated die 104 are provided over the dielectric layer DI. The die 104 is mounted onto the dielectric layer DI having the conductive posts 102 formed thereon. A die attach film is located between the die 104 and the dielectric layer DI for adhering the die 104 onto the dielectric layer DI. The die 104 is surrounded by the conductive posts 102. The die 104 is, for example, a semiconductor die. The die 104 includes an active surface 104a, a plurality of pads 104b distributed on the active surface 104a, a passivation layer 104c covering the active surface 104a, a plurality of conductive pillars 104d, and a protection layer 104e. The pads 104b are partially exposed by the passivation layer 104c, the conductive pillars 104d are disposed on and electrically connected to the pads 104b, and the protection layer 104e covers the conductive pillars 104d and the passivation layer 104c. The conductive pillars 104d are copper pillars or other suitable metal pillars, for example. In some embodiments, the conductive pillars 104d includes a seed layer pattern and a conductive pattern on the seed layer pattern, for example. In some embodiments, the protection layer 104e may be a polybenzoxazole (PBO) layer, a polyimide (PI) layer or other suitable polymers. In some alternative embodiments, the protection layer 104e may be made of inorganic materials.

In some embodiments, an encapsulant 106 is formed on the dielectric layer DI to encapsulate the conductive posts 102 and the die 104. In some embodiments, the encapsulant 106 is a molding compound formed by a molding process. In some alternative embodiments, the insulating encapsulation 106 may include epoxy or other suitable materials. The encapsulant 106 encapsulates the sidewall of the die 104, and the encapsulant 106 is penetrated by the conductive posts 102. In other words, the die 104 and the conductive posts 102 are embedded in the encapsulant 106. It should be noted that although the die 104 and the conductive posts 102 are embedded in the encapsulant 106, the encapsulant 106 exposes a top surface of the die 104 and the conductive posts 102. In other words, the top surfaces of the conductive posts 102, the top surface of the protection layer 104e, and the top surfaces of the conductive pillar 104d are substantially coplanar with the top surface of the encapsulant 106.

Figure 1B:
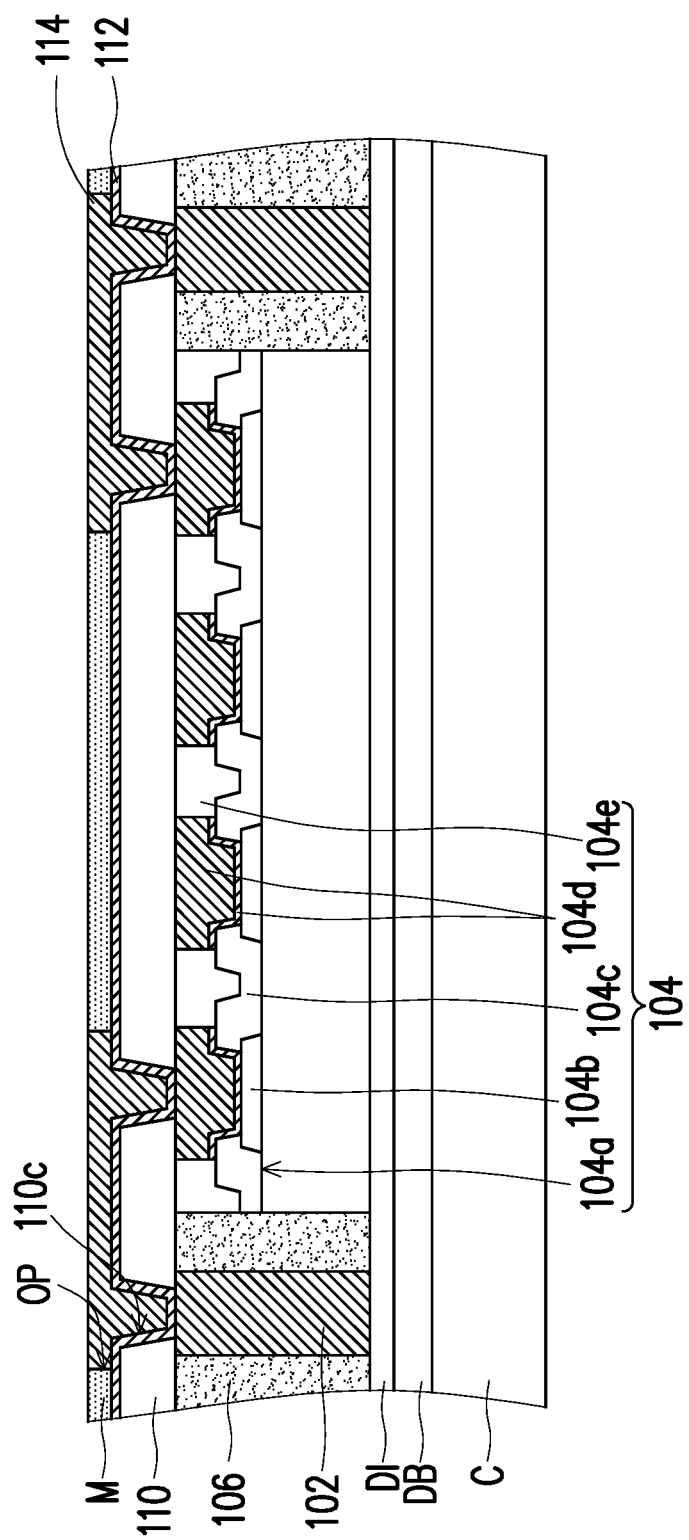
Figure 1C:
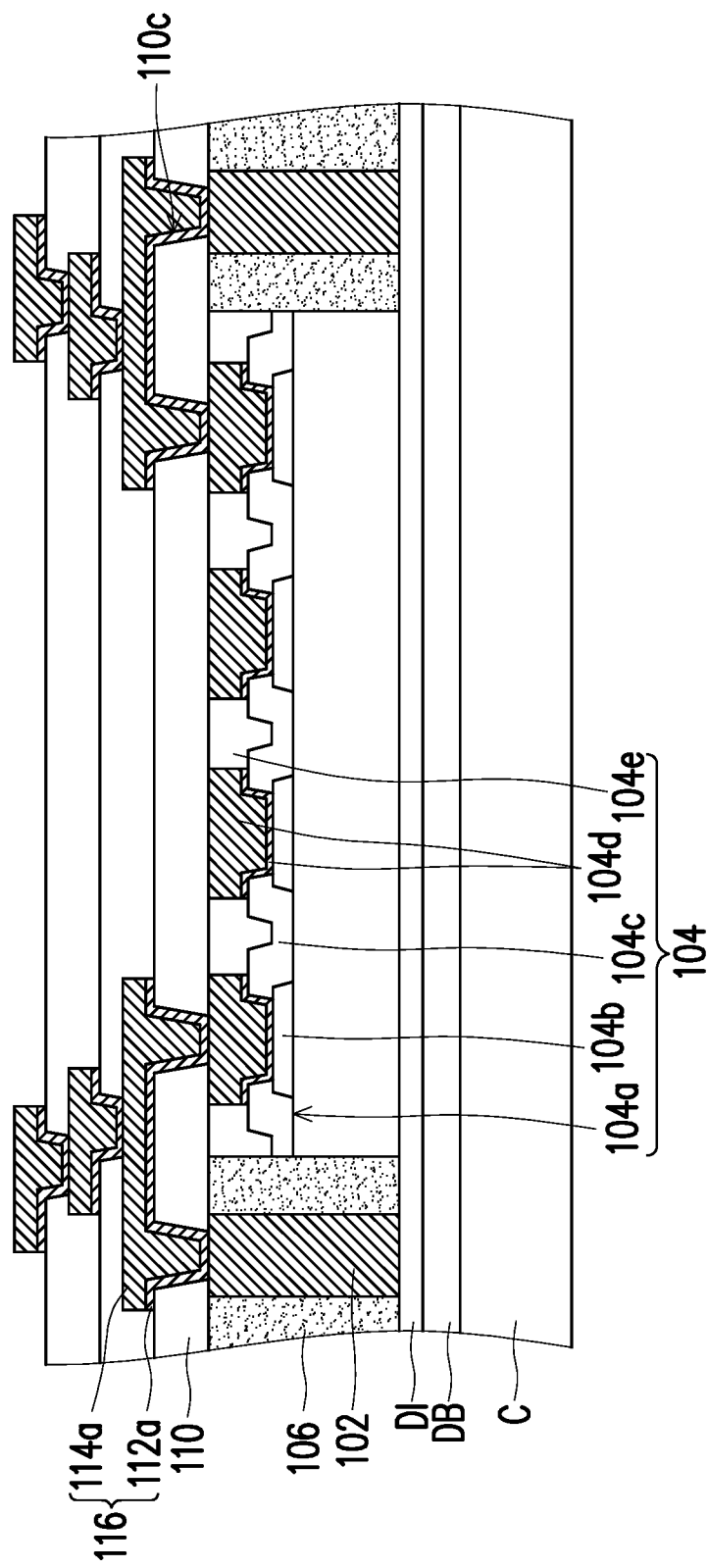

Referring to FIGS. 1B and 1C, after the encapsulant 106 and the protection layer 104e are formed, a redistribution circuit structure is formed on the top surfaces of the conductive posts 102, the top surface of the encapsulant 106, the top surfaces of the conductive pillars 104d, and the top surface of the protection layer 104e. In detail, as shown in FIG. 1B, an inter-dielectric layer 110 is formed over the carrier C, the de-bonding layer DB, the dielectric layer DI, the conductive posts 102, the die 104, and the encapsulant 106. In some embodiments, a material of the inter-dielectric layer 110 includes polybenzoxazole (PBO), polyimide (PI) or other suitable polymers. In some embodiments, a thickness of the inter-dielectric layer 110 ranges from 0.1 µm to 10 µm, for example. In some embodiments, a plurality of contact openings 110c are formed in the inter-dielectric layer 110 so as to render electrical connection between the die 104 and the subsequently formed conductive materials. In some embodiments, a seed layer 112 is formed over the inter-dielectric layer 110. In some embodiments, the seed layer 112 is conformally disposed over the inter-dielectric layer 110. That is, the seed layer 112 extends into the contact openings 110c to cover a bottom surface and sidewalls of the contact openings 110c. In some embodiments, a material of the seed layer 112 may include, for example, copper, copper alloys, or other suitable choice of materials. In some embodiments, the seed layer 112 is formed by a sputtering method, a deposition method such as physical vapor deposition or other applicable methods. In some embodiments, the seed layer 112 may have a thickness of approximately 0.01 µm to approximately 1 µm, for example. In some alternative embodiments, a barrier layer (not shown) may be formed between the contact openings 110c and the seed layer 112, for example.

Then, a mask M may be formed over the seed layer 112, and the mask M has a plurality of openings OP corresponding to the contact openings 110c. A conductive material 114 is filled into the openings OP of the mask M. In some embodiments, the conductive material 114 may be formed by a plating process. The plating process is, for example, electro-plating, electroless-plating, immersion plating, or the like. The conductive material 114 is, for example, copper, copper alloys, or the like. In other words, the seed layer 112 and the conductive material 114 include the same material. For example, the seed layer 112 and the conductive material 114 are made of the same material.

Referring to FIG. 1C, the mask M is subsequently removed to render a plurality of conductive patterns 114a, and portions of the seed layer 112 exposed by the conductive patterns 114a are selectively removed to render a plurality of seed layer patterns 112a. The seed layer patterns 112a and the conductive patterns 114a form a plurality of redistribution conductive pattern 116. In some embodiments, the redistribution conductive pattern 116 includes a via and a conductive line connecting to the via, and the via and the conductive line are formed simultaneously, for example. However, in some alternative embodiments, the via and the conductive line may be formed separately. After the bottommost inter-dielectric layer 110 and the bottommost redistribution conductive patterns 116 are formed, a plurality of inter-dielectric layers 110 and a plurality of redistribution conductive patterns 116 are sequentially and alternately formed and stacked over the die 104. In some embodiments, the redistribution conductive patterns 116 are electrically connected to some of the conductive pillars 104d of the die 104 and the conductive posts 102. In some embodiments, some of the top surfaces of the conductive pillars 104d and the top surfaces of the conductive posts 102 are in contact with the bottommost redistribution conductive patterns 116 of the redistribution circuit structure. The top surfaces of the conductive pillars 104d and the top surfaces of the conductive posts 102 are partially covered by the bottommost inter-dielectric layer 110.

Figure 1D:
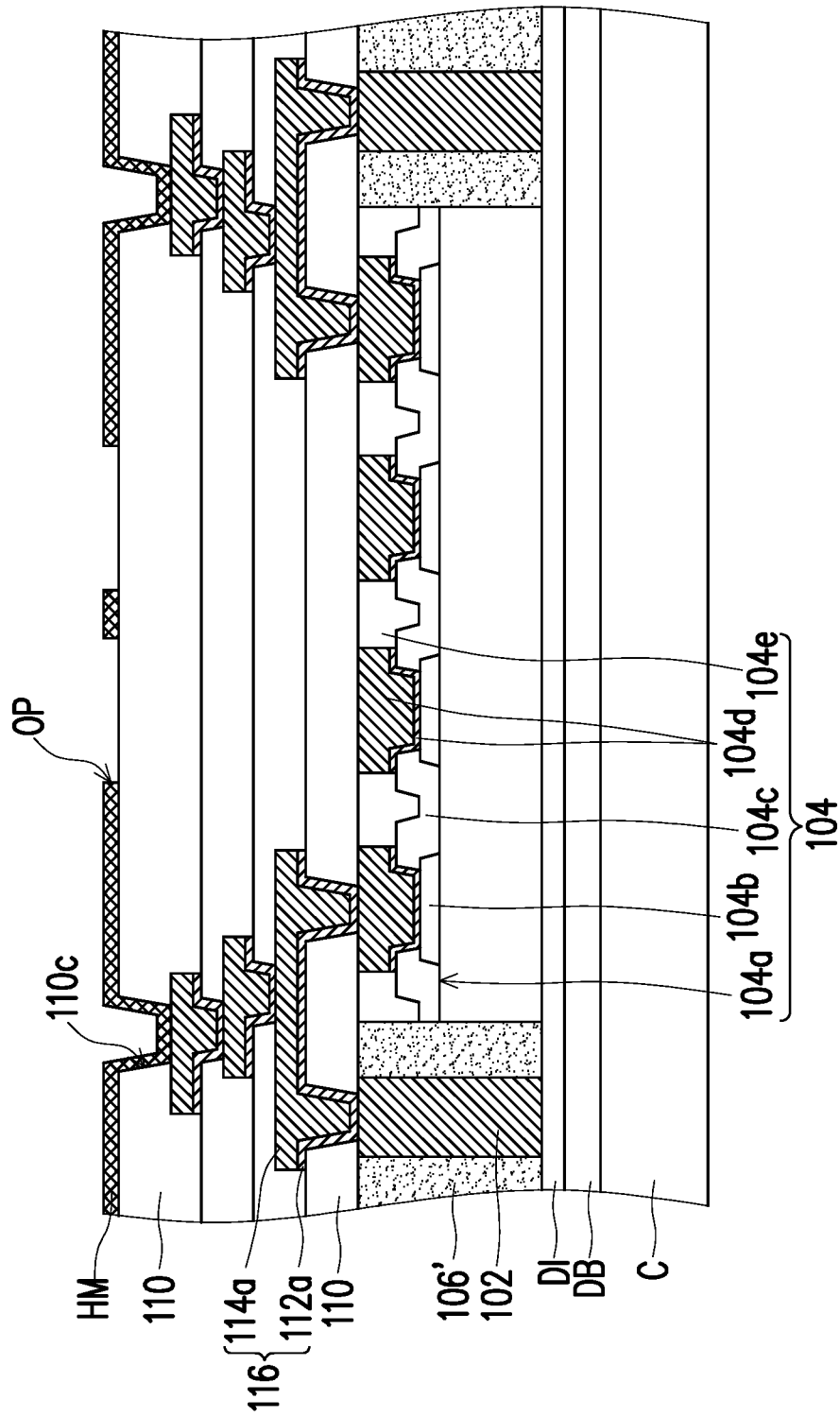

Referring to FIG. 1D, the topmost inter-dielectric layer 110 is formed, and a plurality of contact openings 110c are formed in the topmost inter-dielectric layer 110 to expose the underlying redistribution conductive patterns 116. A mask HM is formed over the topmost inter-dielectric layer 110. In some embodiments, the mask HM is conformally disposed over the topmost inter-dielectric layer 110. That is, the mask HM extends into the contact openings 110c to cover bottom surfaces and sidewalls of the contact openings 110c. In some embodiments, the mask HM may be a hard mask such as a metal hard mask or other suitable mask. The mask HM is patterned to have a plurality of openings OP, and the openings OP expose portions of the topmost inter-dielectric layer 110. It is noted the number of the inter-dielectric layers including the topmost and bottommost inter-dielectric layers is merely for illustration, and the disclosure is not limited thereto.

Figure 1E:
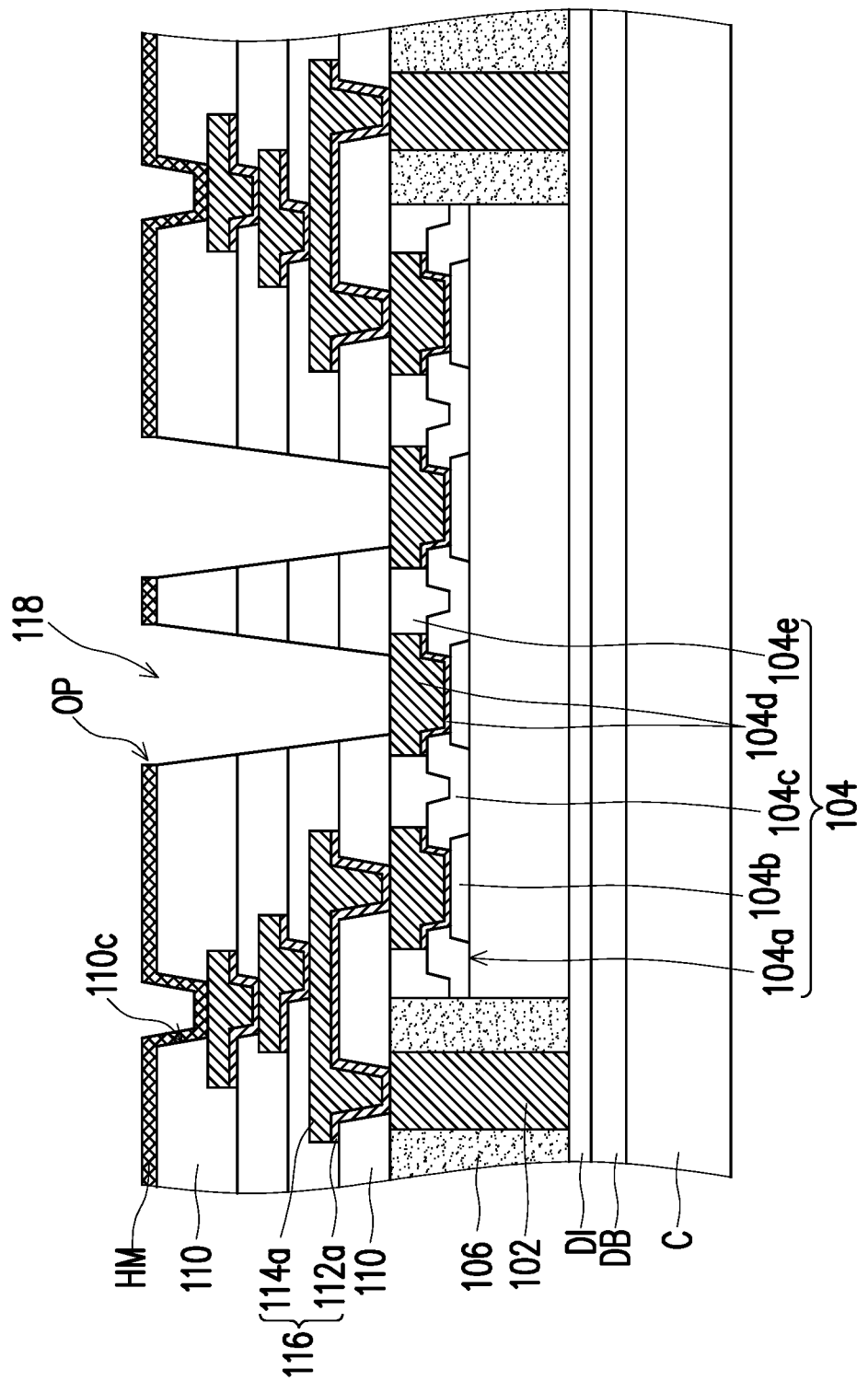

Referring to FIG. 1E, a plurality of via holes 118 are formed in the inter-dielectric layers 110 to expose the die 104. That is, the via hole 118 extends deeply in a plurality of inter-dielectric layers 110. In some embodiments, the via holes 118 expose some of the conductive pillars 104d respectively. In some embodiments, by using the mask HM as a mask, portions of the topmost inter-dielectric layer 110, the bottommost inter-dielectric layer 110 and the inter-dielectric layers 110 between the topmost and bottommost inter-dielectric layers 110 exposed by the openings OP are selectively removed through an anisotropic etching process. In some embodiments, the anisotropic etching process includes a dry etch such as a plasma etch, and the dry etch uses an etchant including $O_2$, $CF_4$, and other suitable gas. In some embodiments, the etchant includes $O_2$ and $CF_4$. In some embodiments, by applying high power ranging from 600 W to 1200 W and low power ranging from 10 mtorr to 100 mtorr, the generated plasma is much more concentrated and provides a more anisotropic etching process. Accordingly, an aspect ratio of the via hole 118 may be improved. In some embodiments, a depth of the via hole 118 is a total thickness of the inter-dielectric layers 110 and ranges from 0.5 μm to 30 μm, for example. In some embodiments, the aspect ratio of the via hole 118 is equal to or larger than 3, 3.5, 4, 4.5, 5, 5.5 or 6, for example. In some embodiments, an aspect ratio of the via hole 118 ranges from 1 to 6 or from 3.5 to 4.5, for example. In some embodiments, a sidewall of the via hole 118 is substantially vertical, and a surface of the sidewall of the via hole 118 is substantially smooth.

Figure 1F:
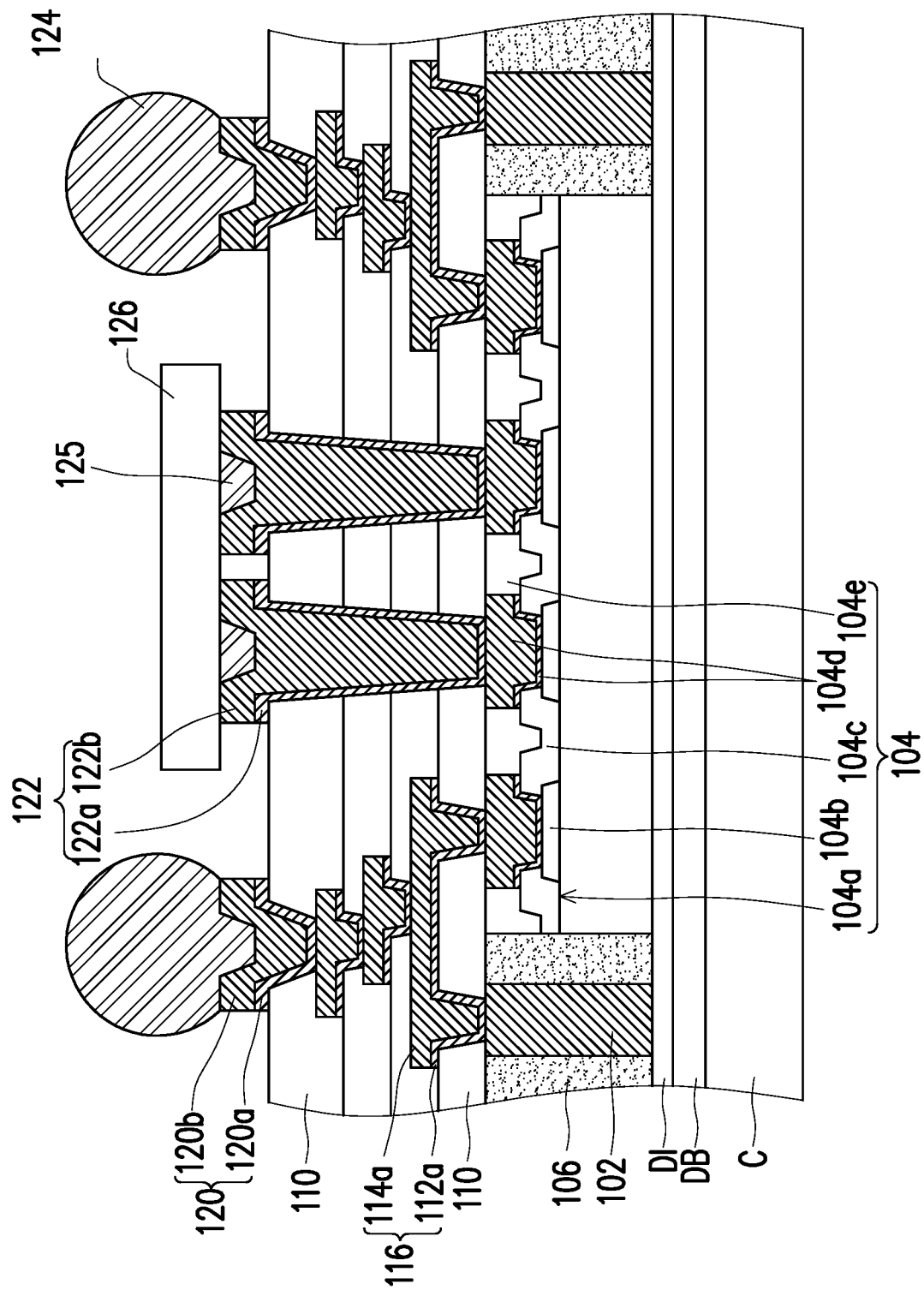

Referring to FIG. 1F, the mask HM is removed. Then, a plurality of under-ball metallurgy (UBM) patterns 120 are formed in the contact openings 110c of the topmost inter-dielectric layer 110, to electrically connect the redistribution conductive patterns 116 respectively. A plurality of vias 122 are formed in the via holes 118 in the inter-dielectric layers 110, to electrically connect some of the conductive pillars 104d of the die 104 respectively. In some embodiments, the UBM patterns 120 and the vias 122 may be formed simultaneously. In some alternative embodiments, the UBM patterns 120 and the vias 122 may be formed separately. In some alternative embodiments, the UBM patterns 120 may be formed before forming the mask HM, and the mask HM is formed to cover the UBM patterns 120, so as to avoid the damage to the formed UBM patterns 120. In some embodiments, the UBM patterns 120 and the vias 122 respectively include a seed layer pattern 120a, 122a and a conductive pattern 120b, 122b, for example. The materials and the forming methods of the seed layer pattern 120a, 122a and the conductive pattern 120b, 122b are similar to those of the seed layer pattern 112a and the conductive pattern 112b. In some embodiments, the seed layer pattern 120a, 122a is formed by a sputtering method, and the conductive pattern 120b, 122b is formed by a plating process, for example. Materials of the seed layer pattern 120a, 122a and the conductive pattern 120b, 122b include, for example, copper, copper alloys, or the like.

In some embodiments, the via 122 is continuously and integrally formed by one filling process. The via 122 continuously penetrates through a plurality of inter-dielectric layers 110 including the bottommost and topmost inter-dielectric layers 110. In some embodiments, the via 122 is substantially a deep via having a height larger than 5 μm, for example. In some embodiments, the via 122 is partially disposed on the topmost inter-dielectric layer 110, and the portion of the via 122 on the topmost inter-dielectric layer 110 serves as a connecting pad. In some embodiments, top surfaces of the vias 122 are substantially flush with top surfaces of the UBM patterns 120. In some embodiments, the vias 122 are disposed side by side and surrounded by the redistribution conductive patterns 116, for example. However, the disclosure is not limited thereto, in some alternative embodiments, the vias 122 and the redistribution conductive patterns 116 may have other suitable arrangement.

A plurality of conductive terminals 124 are placed on the UBM patterns 120, and a plurality of passive components 126 are mounted on the vias 122. In some embodiments, the conductive terminals 124 may be placed on the UBM patterns 120 through a ball placement process or other suitable processes and the passive components 126 may be mounted on the vias 122 through a soldering process, a reflowing process, or other suitable processes. In some embodiments, one passive components 126 may be mounted on and electrically connected to a plurality of vias 122 through a micro-bump 125, for example. In some alternative embodiments, the via 122 may be electrically connected to other suitable component rather than the passive component.

Figure 1G:
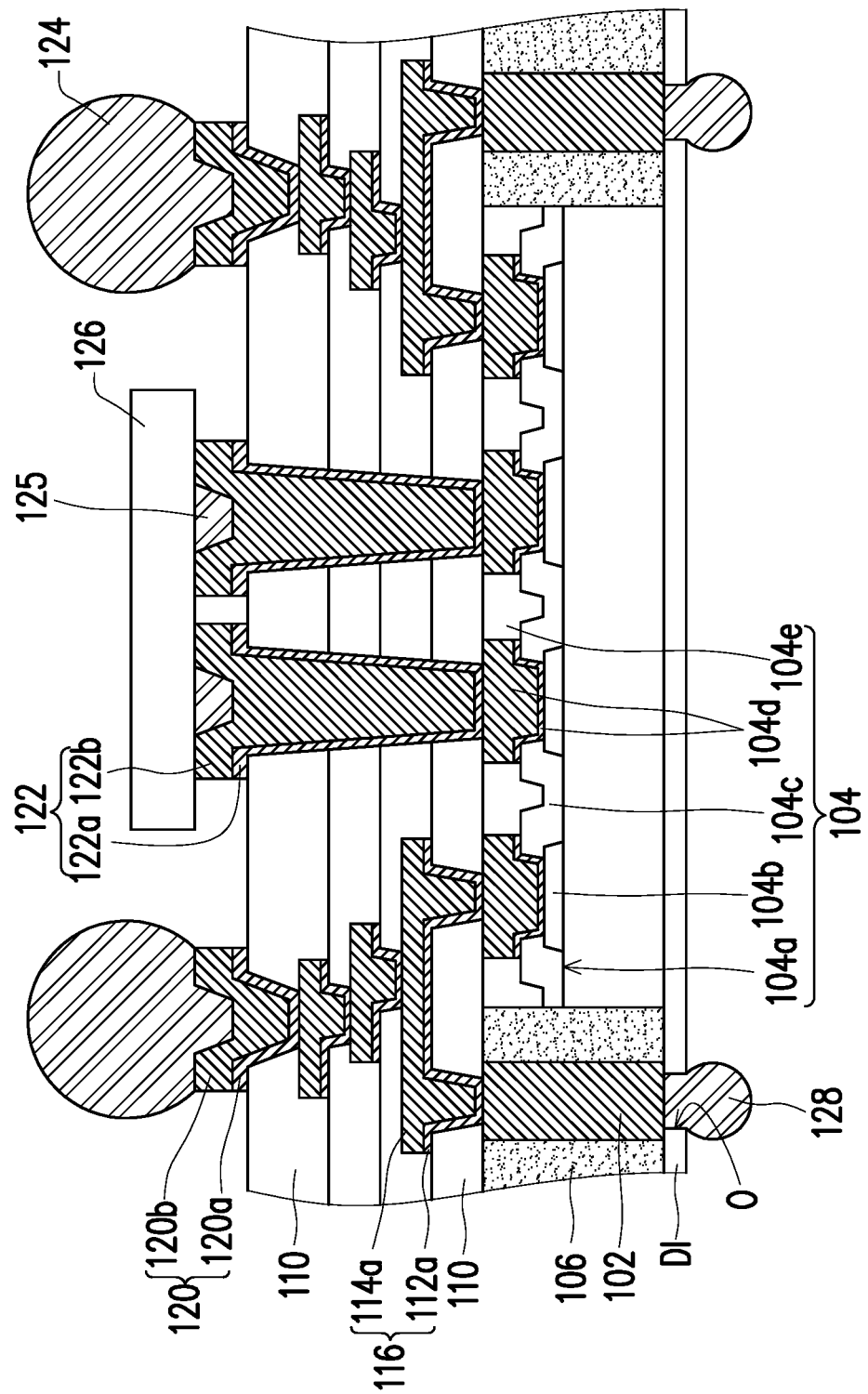

Referring to FIG. 1G, after the conductive terminals 124 and the passive components 126 are mounted on the UBM patterns 120 and the vias 122, the dielectric layer DI formed on the bottom surface of the encapsulant 106 is de-bonded from the de-bonding layer DB such that the dielectric layer DI is separated from the carrier C. That is, the carrier C is removed. In some embodiments, the de-bonding layer DB (e.g., the LTHC release layer) may be irradiated by an UV laser such that the dielectric layer DI adhered on the bottom surface of the encapsulant 106 is peeled from the carrier C. As illustrated in FIG. 1G, the dielectric layer DI is then patterned such that a plurality of contact openings O is formed to partially expose the conductive posts 102. The number of the contact openings O corresponds to the number of the conductive posts 102. In some embodiments, the contact openings O of the dielectric layer DI are formed by a laser drilling process, a mechanical drilling process, or other suitable processes.

After the contact openings O are formed in the dielectric layer DI, a plurality of conductive terminals 128 are placed in the contact openings O, and the conductive terminals 128 are electrically connected to the conductive posts 102. Herein, a semiconductor package such as an integrated fan-out (INFO) package is substantially completed. In some alternative embodiments, after the conductive terminals 124 and the conductive terminals 128 are formed, the package array is diced to form a plurality of packages having dual-side terminal design. In some alternative embodiments, the dicing process or singulation process typically involves dicing with a rotating blade or a laser beam. In other words, the dicing or singulation process is, for example, a laser cutting process, a mechanical cutting process, or other suitable processes. In some alternative embodiments, the package may be stack with other electronic devices such as an IC package, an INFO package, a memory device, a ball grid array (BGA), or a wafer. Furthermore, the stacking may be performed preceding the dicing process. For example, in some alternative embodiments, the formed package array may be stacked with a wafer, and the singulation process may be performed on the stacked package array and the wafer simultaneously.

Figure 2:
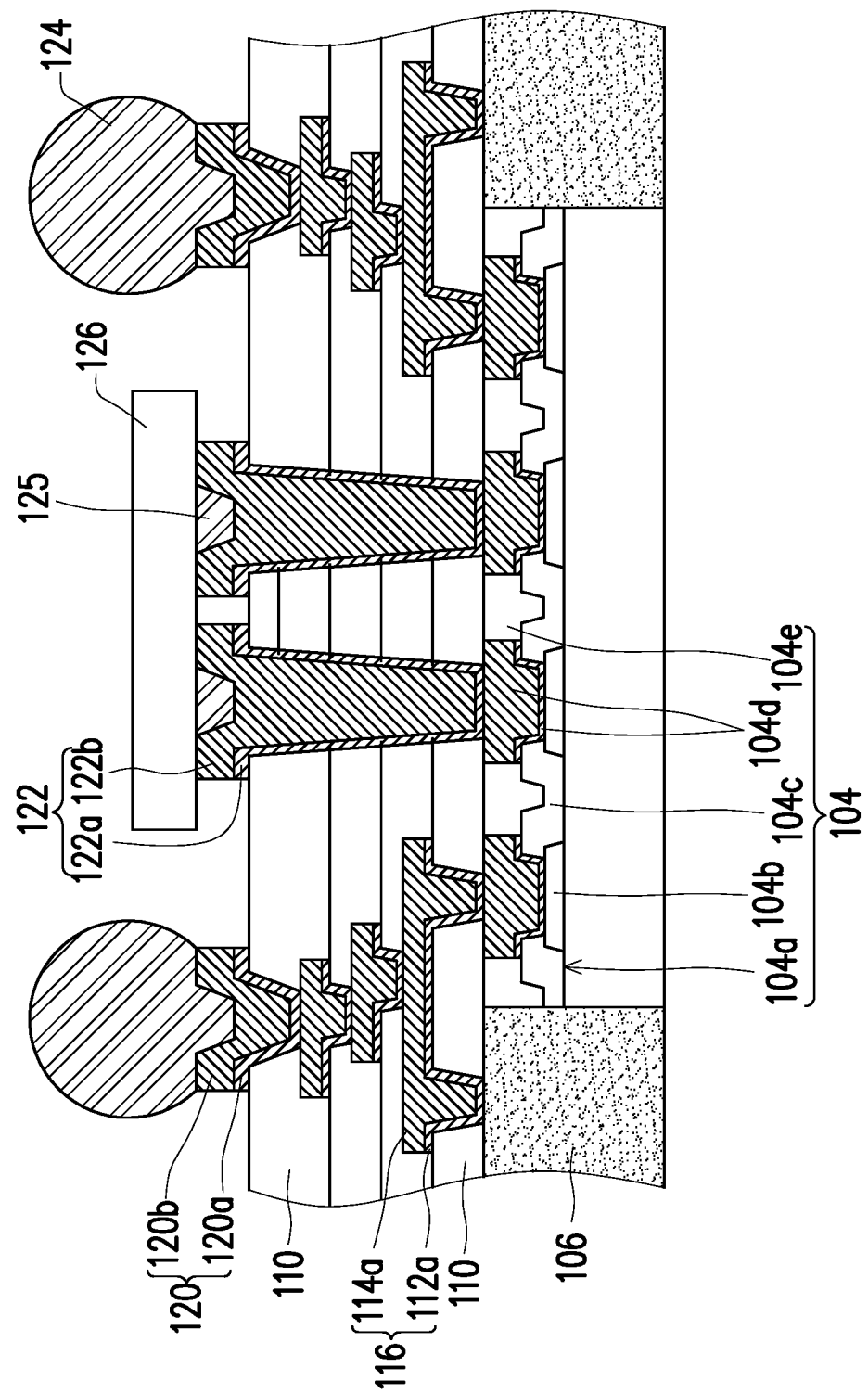
FIG. 2 is a schematic cross-sectional view illustrating a semiconductor package in accordance with some embodiments of the disclosure.

In some embodiments, the conductive posts 102 are formed aside the die 104. However, the disclosure is not limited thereto. In some alternative embodiments, as shown in FIG. 2, the conductive posts 102 and thus the dielectric layer DI and the conductive terminals 128 may be omitted. In other words, the die 104 may be encapsulated by the encapsulant 106 without the conductive posts 102 therethrough.

Figure 3A:
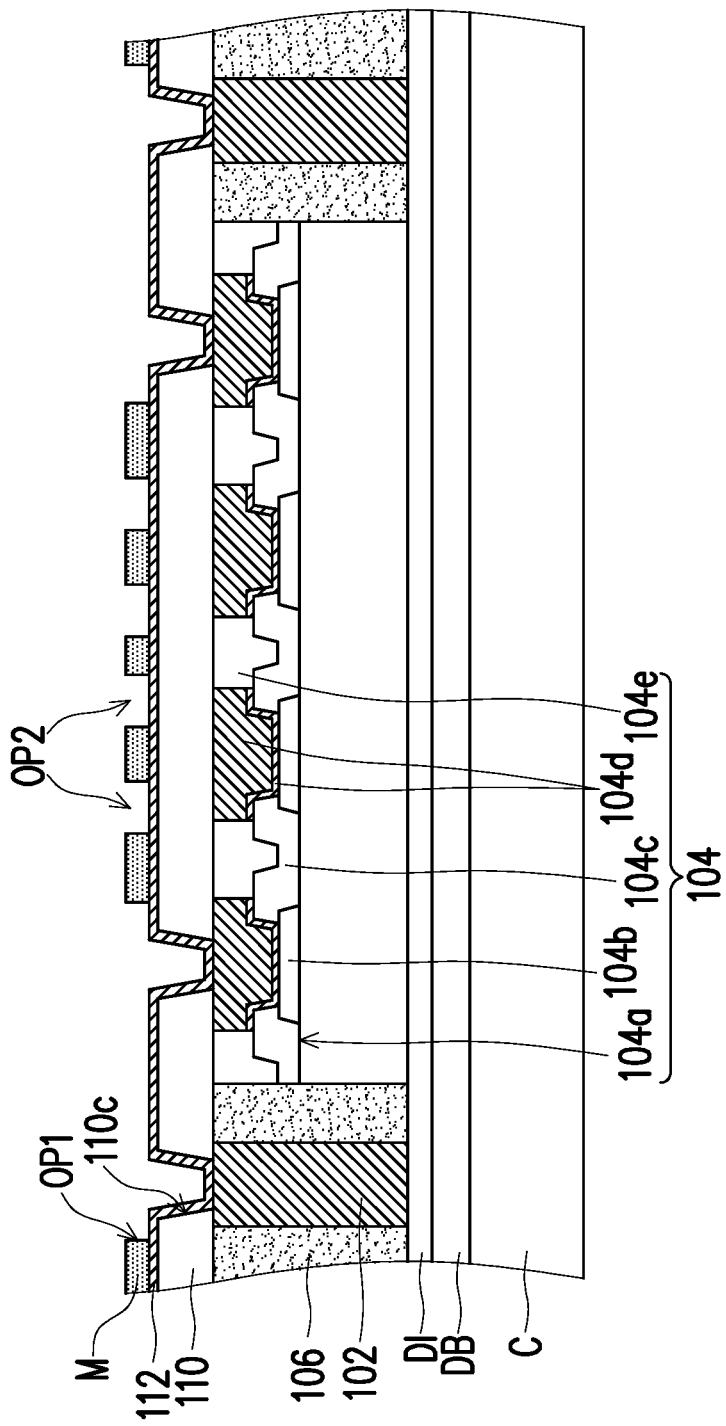
FIGS. 3A-3G are schematic cross-sectional views illustrating a manufacturing process of a semiconductor package in accordance with some embodiments of the disclosure.

FIGS. 3A-3G are schematic cross-sectional views illustrating a manufacturing process of a semiconductor package in accordance with some embodiments of the disclosure. The steps of FIGS. 3A-3G follow the procedures of FIG. 1A, in other words, the step of FIG. 3A is continuously performed after the step of FIG. 1A. The elements similar to or substantially the same as the elements described previously will use the same reference numbers, and certain details or descriptions of the same elements may not be repeated herein. Referring to FIG. 3A, an inter-dielectric layer 110 (i.e., the bottommost inter-dielectric layer 110) is formed over a die 104 and an encapsulant 106, and a plurality of contact openings 110c are formed in the inter-dielectric layer 110 to expose some of the conductive pillars 104d of the die 104. In some embodiments, a seed layer 112 is conformally formed over the inter-dielectric layer 110.

Then, a mask M is formed over the inter-dielectric layer 110, and the mask M is patterned to have a plurality of openings OP1, OP2. In some embodiments, the openings OP1 are formed corresponding to the contact openings 110c, and the openings OP2 are formed corresponding to a region substantially surrounding the conductive pillar 104d of the die 104, respectively. In some embodiments, the openings OP2 are shaped as rings, for example.

Figure 3B:
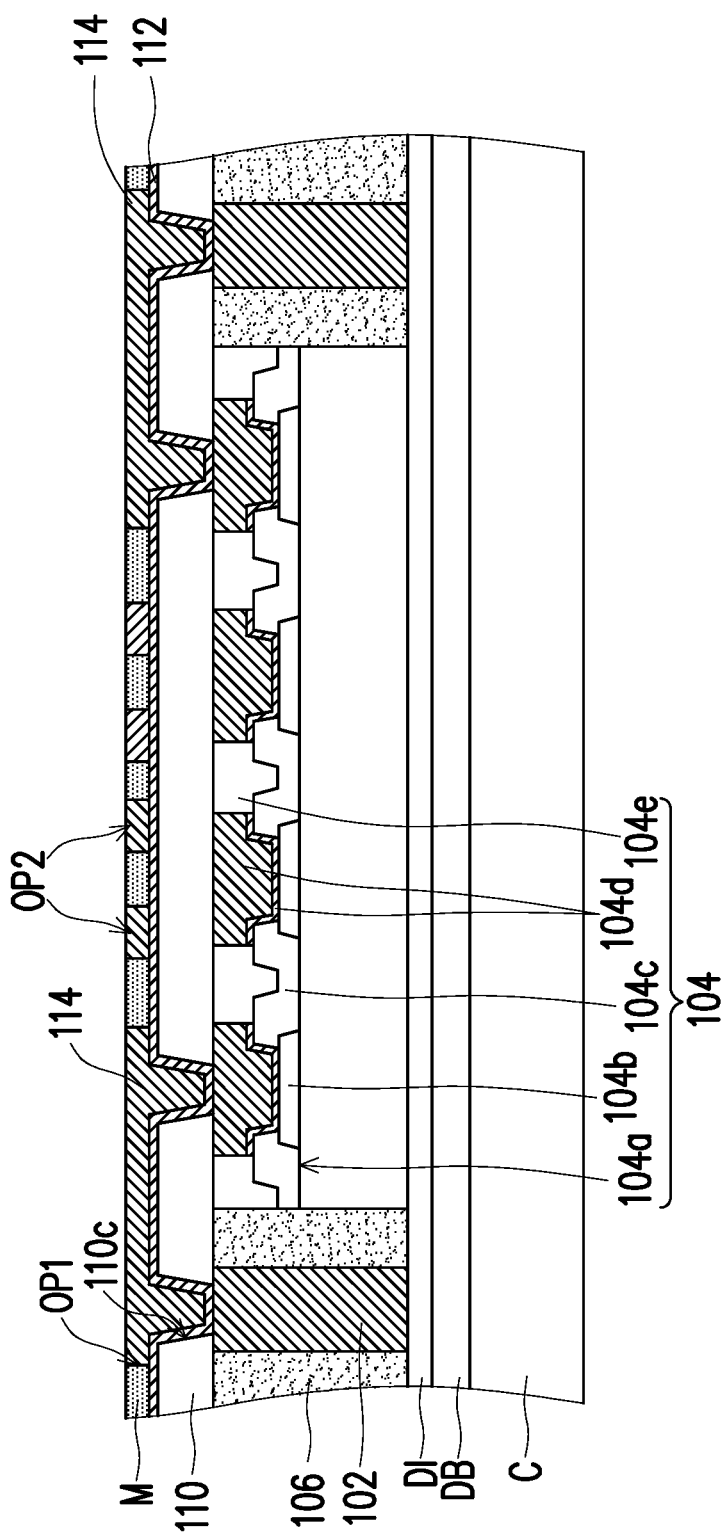

Referring to FIG. 3B, a conductive material 114 is filled into the openings OP1, OP2 of the mask M. In some embodiments, the conductive material 114 may be formed by a plating process. The plating process is, for example, electro-plating, electroless-plating, immersion plating, or the like. The conductive material 114 is, for example, copper, copper alloys, or the like. In other words, the seed layer 112 and the conductive material 114 include the same material. For example, the seed layer 112 and the conductive material 114 are made of the same material.

Figure 3C:
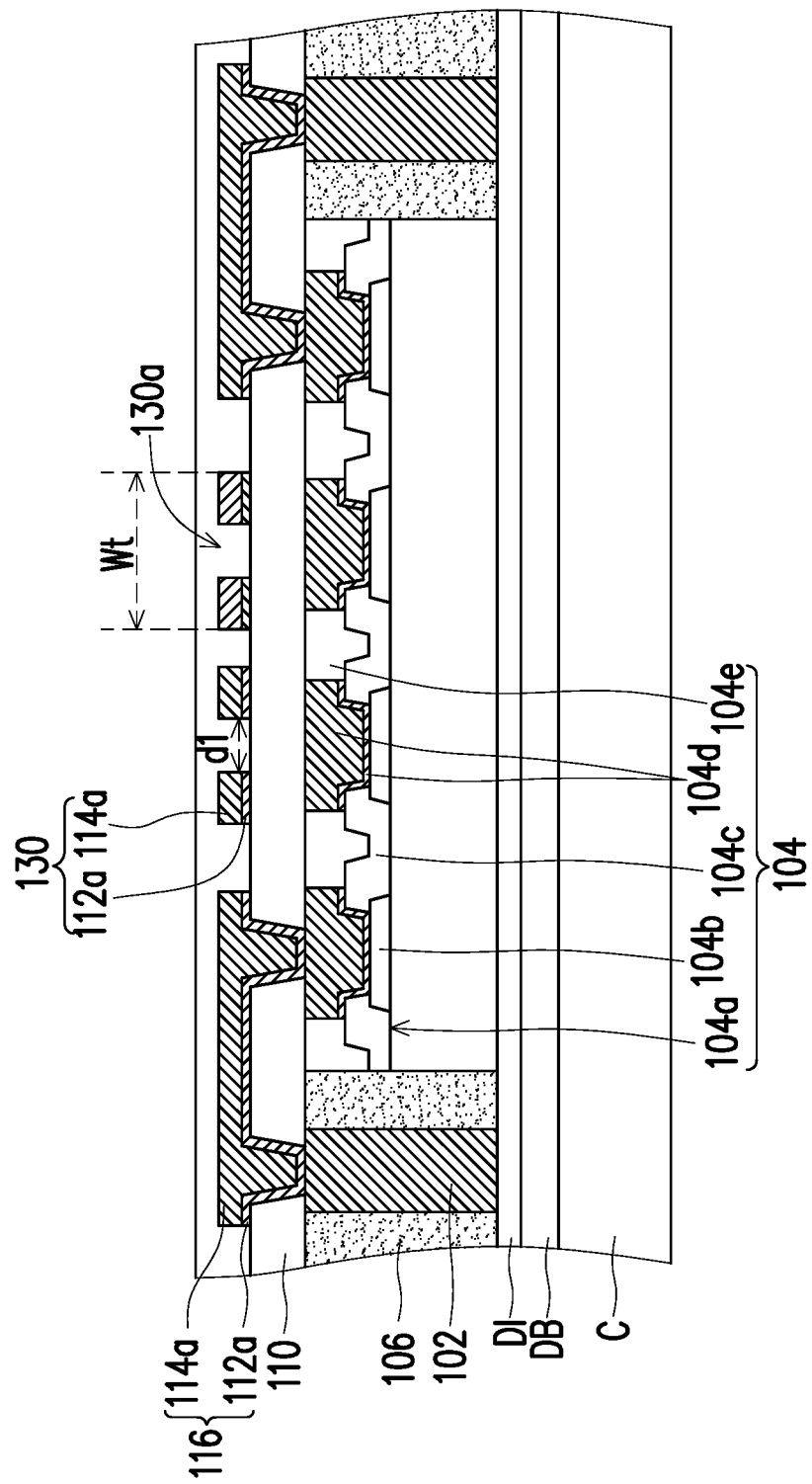

Referring to FIG. 3C, the mask M is subsequently removed to render a plurality of conductive patterns 114a, and portions of the seed layer 112 exposed by the conductive patterns 114a are selectively removed to render a plurality of seed layer patterns 112a. The seed layer patterns 112a and the conductive patterns 114a form a plurality of redistribution conductive patterns 116 and a plurality of rings 130. In some embodiments, the redistribution conductive patterns 116 are formed on and in the inter-dielectric layer 110 to electrically connect the die 104. On contrary, the rings 130 are formed on the inter-dielectric layer 110 and electrically insulated from the die 104 by the inter-dielectric layer 110 therebetween. In some embodiments, the redistribution conductive patterns 116 and the rings 130 may be formed simultaneously, for example. However, in some alternative embodiments, the redistribution conductive patterns 116 and the rings 130 may be formed separately. In addition, in some alternative embodiments, the redistribution conductive patterns 116 and the rings 130 may have different materials. In some alternative embodiments, the rings 130 may have non-conductive material, and the non-conductive material may have an etching selectivity with respect to the inter-dielectric layer 110, for example. In some embodiments, the ring 130 has a hollow portion 130a, and the hollow portion 130a may be disposed directly on the conductive pillar 104d. An inner diameter d1 of the ring 130 (i.e., a diameter of the hollow portion 130a) is substantially smaller than a top width of the conductive pillar 104d, for example. In some embodiments, a total width Wt (i.e., an outer diameter) of the rings 130 is substantially the same as or larger than the top width of the conductive pillar 104d, for example.

Figure 3D:
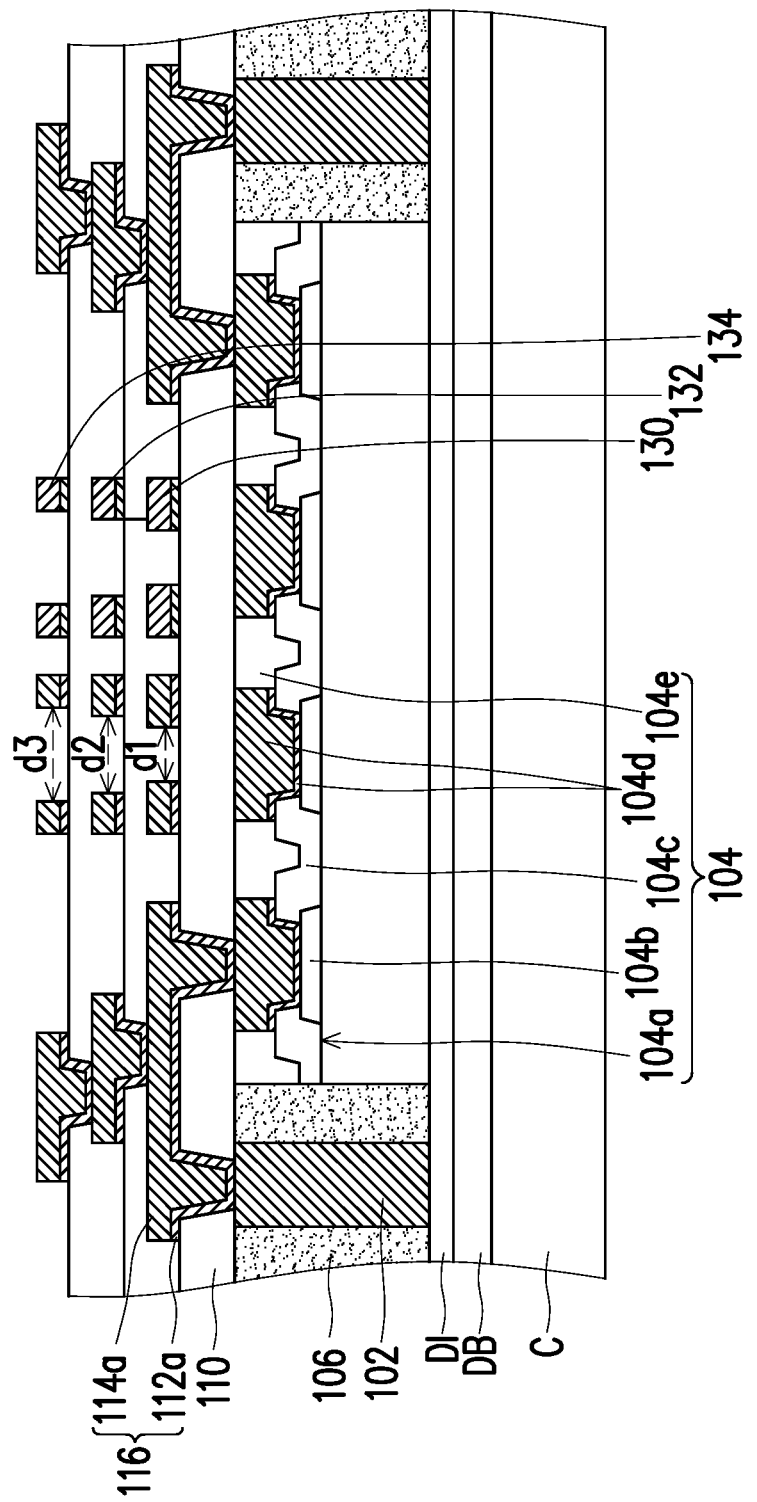

Referring to FIG. 3D, a plurality of inter-dielectric layers 110, a plurality of redistribution conductive patterns 116 and a plurality of rings 132, 134 are sequentially formed over the die 104. The forming method of the redistribution conductive patterns 116 and the rings 132, 134 may be similar to those describe above. In some embodiments, an inner diameter d2 of the ring 132 is larger than the inner diameter d1 of the underlying ring 130. Similarly, an inner diameter d3 of the ring 134 is larger than the inner diameter d2 of the underlying ring 132. In other words, the inner diameters d1, d2, d3 of the rings 130, 132, 134 may be increasing as vertical distances between the rings 130, 132, 134 and the die 104 are increasing. In some embodiments, center axes of the rings 130, 132, 134 are substantially the same, and the outer edges of the rings 130, 132, 134 are aligned with one another, for example. In other words, a total width Wt of the rings 130, 132, 134 is substantially the same as or larger than the top width of the conductive pillar 104d, for example. However, the disclosure is not limited thereto. In some alternative embodiments, the center axes of the rings 130, 132, 134 may be different but parallel to one another, and the outer edges of the rings 130, 132, 134 may not be aligned with one another. In some embodiments, the center axes of the rings 130, 132, 134 are aligned to a center axis of the conductive pillar 104d, for example. In some alternative embodiments, the center axes of the rings 130, 132, 134 may not be aligned to the center axis of the conductive pillar 104d.

Figure 3E:
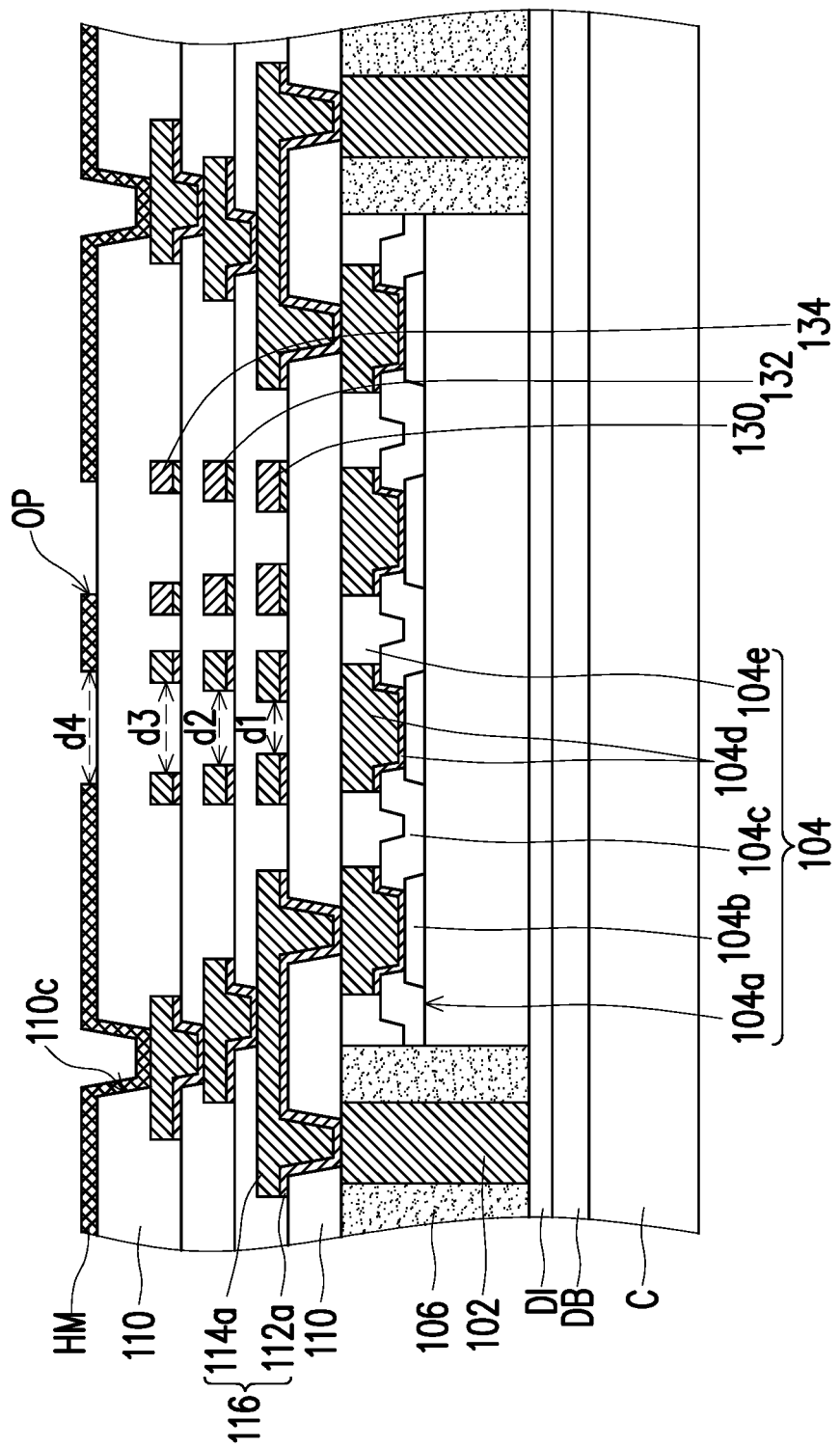

Referring to FIG. 3E, a topmost inter-dielectric layer 110 is formed, and a plurality of contact openings 110c are formed in the topmost inter-dielectric layer 110 to expose the underlying redistribution conductive patterns 116. A mask HM is formed over the topmost inter-dielectric layer 110. In some embodiments, the mask HM is conformally disposed over the topmost inter-dielectric layer 110. That is, the mask HM extends into the contact openings 110c to cover a bottom surface and sidewalls of the contact openings 110c. In some embodiments, the mask HM may be a hard mask such as a metal hard mask or other suitable mask. The mask HM is patterned to have a plurality of openings OP, and the openings OP expose portions of the topmost inter-dielectric layer 110. In some embodiments, the opening OP is directly disposed on the ring 134, that is, an edge of the opening OP is within a range between the outer edge and the inner edge of the ring 134. A diameter d4 of the opening OP is larger than the inner diameter d3 of the ring 134. In some embodiments, a diameter of the opening OP is larger than 0.5 μm, for example.

Figure 3F:
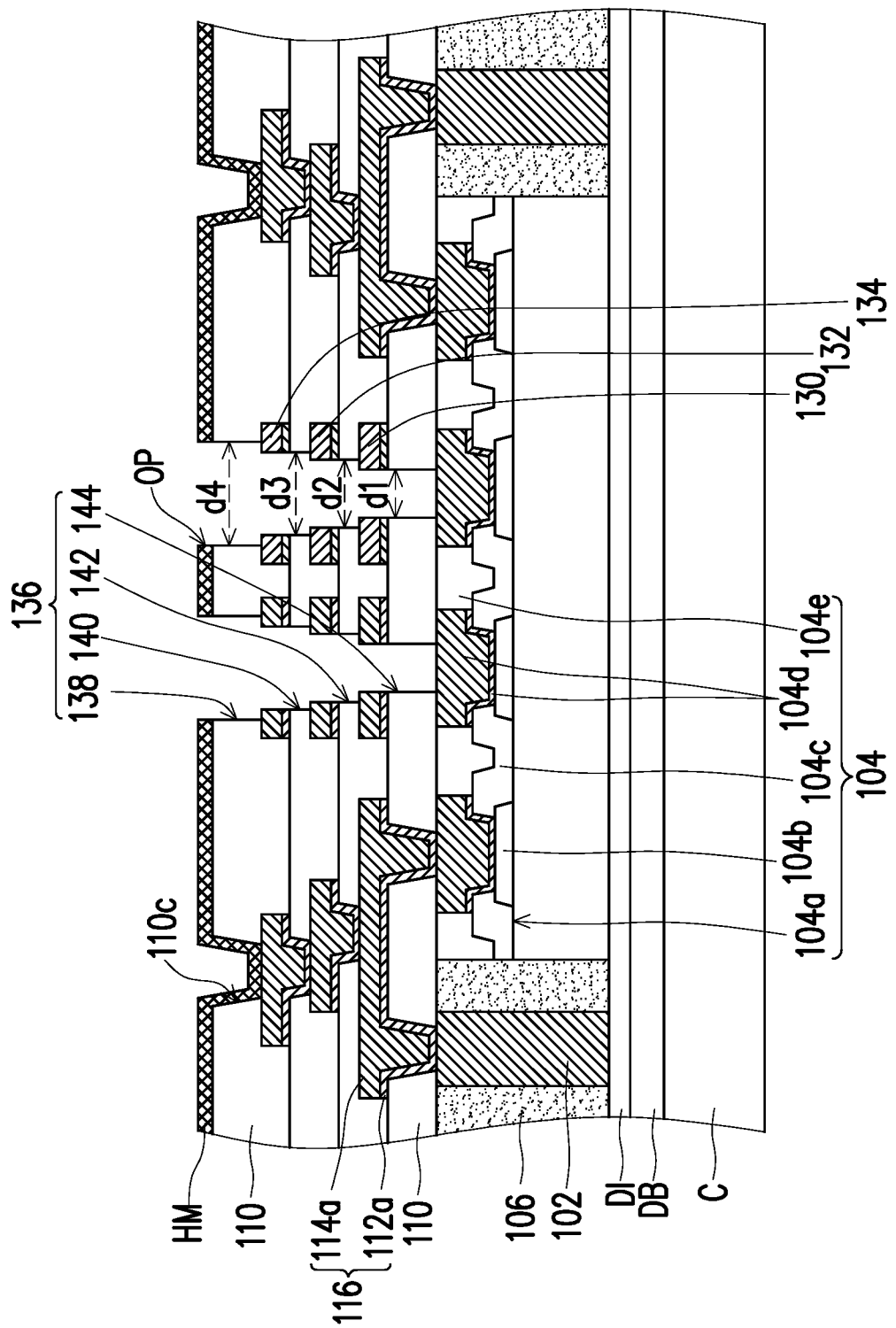

Referring to FIG. 3F, by using the mask HM and the rings 130, 132, 134 as masks, a plurality of multi-step shaped via holes 136 are formed. In some embodiments, by using the mask HM as a mask and the ring 134 as an etch stop layer, a portion of the dielectric layer 110 over the ring 134 is removed, so as to form a via hole 138 exposing a portion of the ring 134. A diameter d4 of the via hole 138 is equal to the diameter of the opening OP and larger than the inner diameter d3 of the ring 134. Then, by using the ring 134 as a mask and the ring 132 as an etch stop layer, a portion of the dielectric layer 110 over the ring 132 is removed, so as to form a via hole 140 exposing a portion of the ring 132. A diameter of the via hole 140 is equal to the inner diameter d2 of the ring 134. After that, similarly, by using the ring 132 as a mask and the ring 130 as an etch stop layer, a portion of the dielectric layer 110 over the ring 130 is removed, so as to form a via hole 142 exposing a portion of the ring 130. A diameter d1 of the via hole 142 is equal to the inner diameter d1 of the ring 130. Then, by using the bottommost ring 130 as a mask, a portion of the dielectric layer 110 is removed, so as to form a via hole 144 exposing the conductive pillar 104d of the die 104. In some embodiments, the multi-step shaped via hole 136 has a plurality of diameters d4, d3, d2, d1 sequentially decreasing from the top to the bottom. It is noted numbers of the inter-dielectric layers and the rings are merely for illustration, and the disclosure is not limited thereto. In some alternative embodiments, one ring may be formed between two inter-dielectric layers, and a step shaped via hole may be formed by the one ring, for example. In addition, since the materials of the rings 130, 132, 134 have the same or similar etching selectivity and the materials of the inter-dielectric layers 110 have the same or similar etching selectivity, the via holes 138, 140, 142, 144 may be formed sequentially in the same etching process. In some alternative embodiments, the via holes 138, 140, 142, 144 may be formed by different etching process, for example. In some embodiments, the etching process includes a dry etch such as a plasma etch, and the dry etch uses an etchant including $O_2$, $CF_4$, and other suitable gas. In some embodiments, a depth of the multi-step shaped via hole 136 is a total thickness of the inter-dielectric layers 110 and ranges from 0.1 µm to 10 µm, for example. In some embodiments, an aspect ratio of the multi-step shaped via hole 136 is equal to or larger than 3, 3.5, 4, 4.5, 5, 5.5 or 6, for example. In some embodiments, an aspect ratio of the multi-step shaped via hole 136 ranges from 1 to 6 or from 3.5 to 4.5, for example.

Figure 3G:
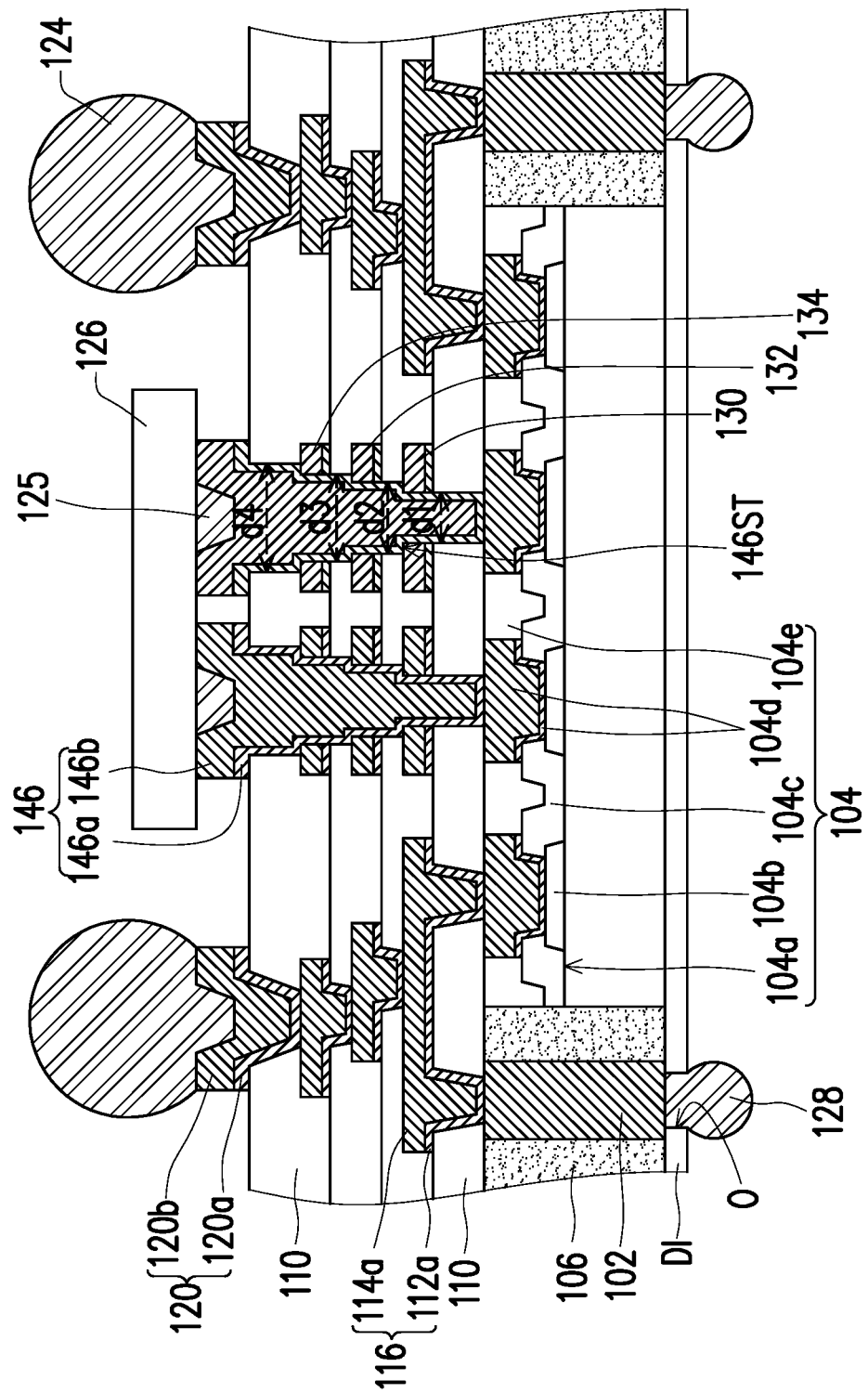
Figure 4:
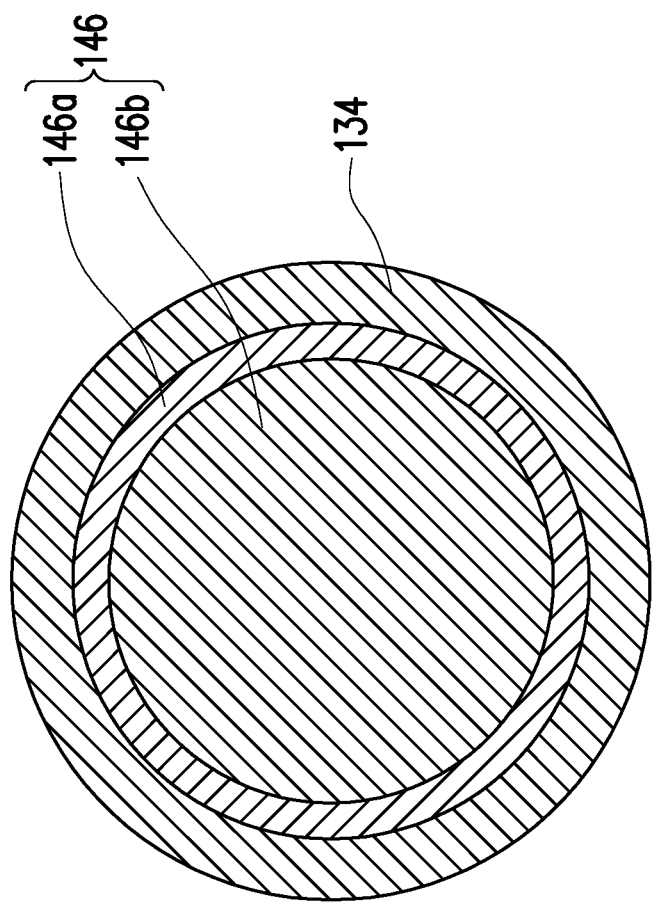
FIG. 4 is a schematic view illustrating a ring and a multi-step shaped via in accordance with some embodiments of the disclosure.

Referring to FIG. 3G, the mask HM is removed. Then, a plurality of UBM patterns 120 is formed in the contact openings 110c of the topmost inter-dielectric layer 110 to electrically connect the redistribution conductive patterns 116. A plurality of multi-step shaped vias 146 are formed in the multi-step shaped via holes 136 to electrically connect the conductive pillars 104d of the die 104. In some embodiments, the multi-step shaped via 146 is continuously and integrally formed by one filling process. In some embodiments, the UBM patterns 120 and the multi-step shaped vias 146 respectively include a seed layer pattern 120a, 146a and a conductive pattern 120b, 146b, for example. In some embodiments, the ring 130, 132, 134 surrounds and is in contact with a sidewall of the multi-step shaped via 146. For example, as shown in FIG. 4, the ring 134 surrounds and is in contact with a portion of the sidewall of the multi-step shaped via 146. In some embodiments, the multi-step shaped via 146 has a plurality of diameters defined by the diameter d4 of the opening OP of the mask HM and the inner diameters d1, d2, d3 of the rings 130, 132, 134. In some embodiments, the multi-step shaped vias 146 includes a plurality of steps 146ST directly disposed on and being in contact with the rings 134 respectively. Specifically, the step 146ST is disposed on the inner portion of the ring 134, for example. In some embodiments, the ring 130, 132, 134 is like a wing, and thus the ring 130, 132, 134 may be also referred to a via wing.

Then, a plurality of conductive terminals 124 are placed on the UBM patterns 120, and a plurality of passive components 126 are mounted on the multi-step shaped vias 146. In some embodiments, the multi-step shaped via 146 has a plurality of different diameters (such as the diameters d1, d2, d3, d4). Then, the dielectric layer DI is separated from the carrier C, and a plurality of contact openings O is formed in the dielectric layer DI to partially expose the conductive posts 102. After that, a plurality of conductive terminals 128 are placed in the contact openings O, and the conductive terminals 128 are electrically connected to the conductive posts 102.

Figure 5A:
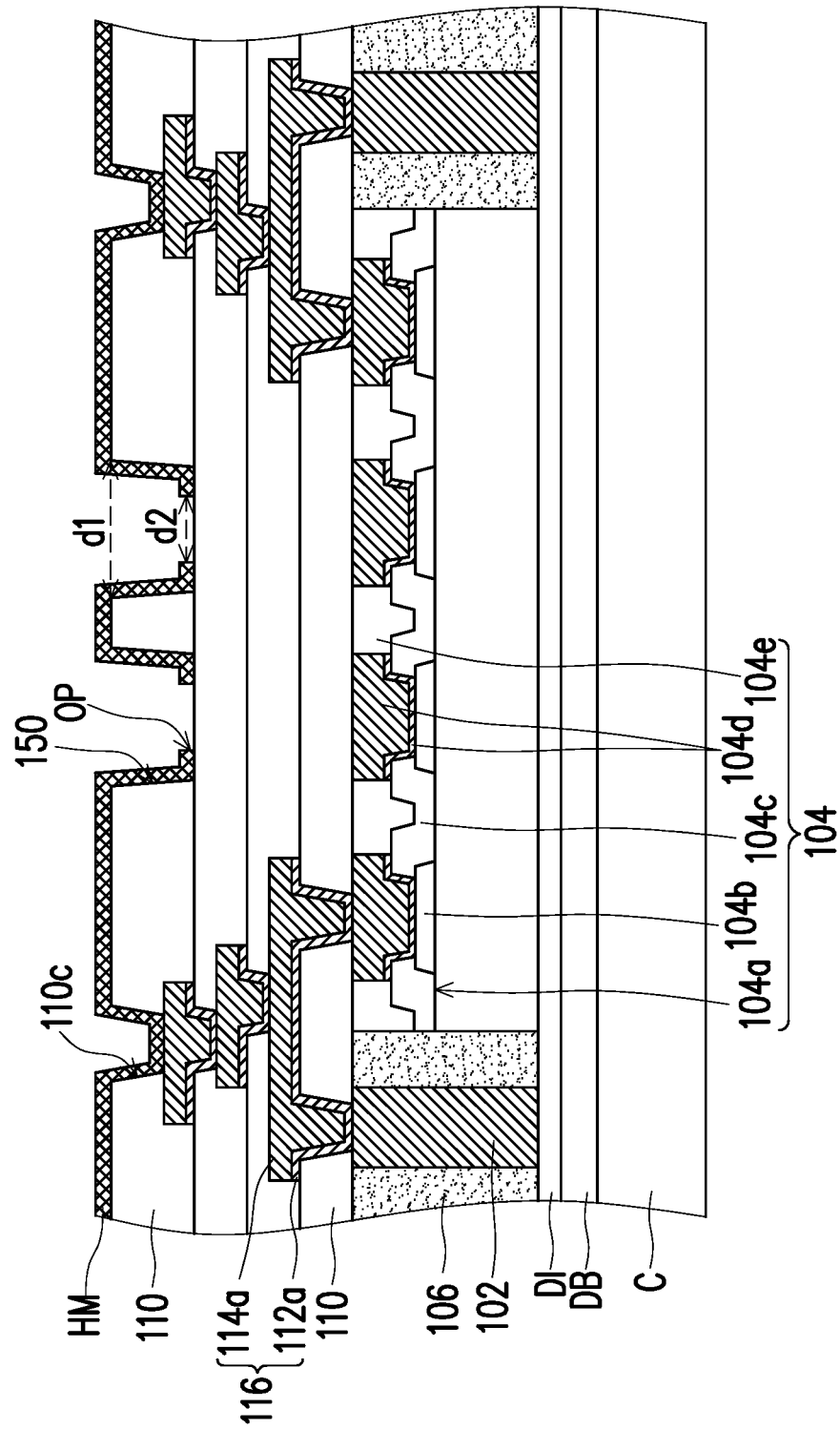
FIGS. 5A-5C are schematic cross-sectional views illustrating a manufacturing process of a semiconductor package in accordance with some embodiments of the disclosure.
Figure 5B:
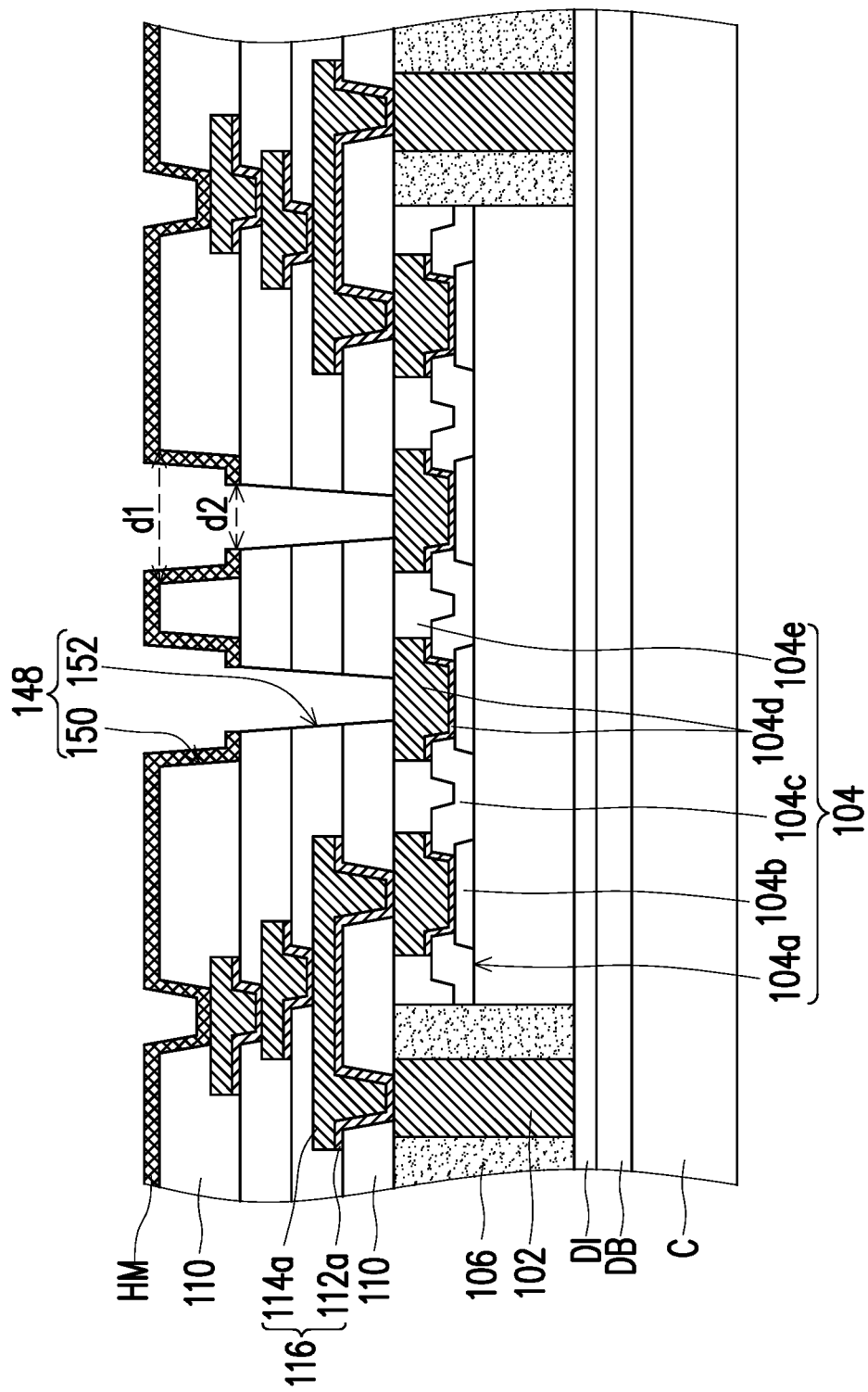
Figure 5C:
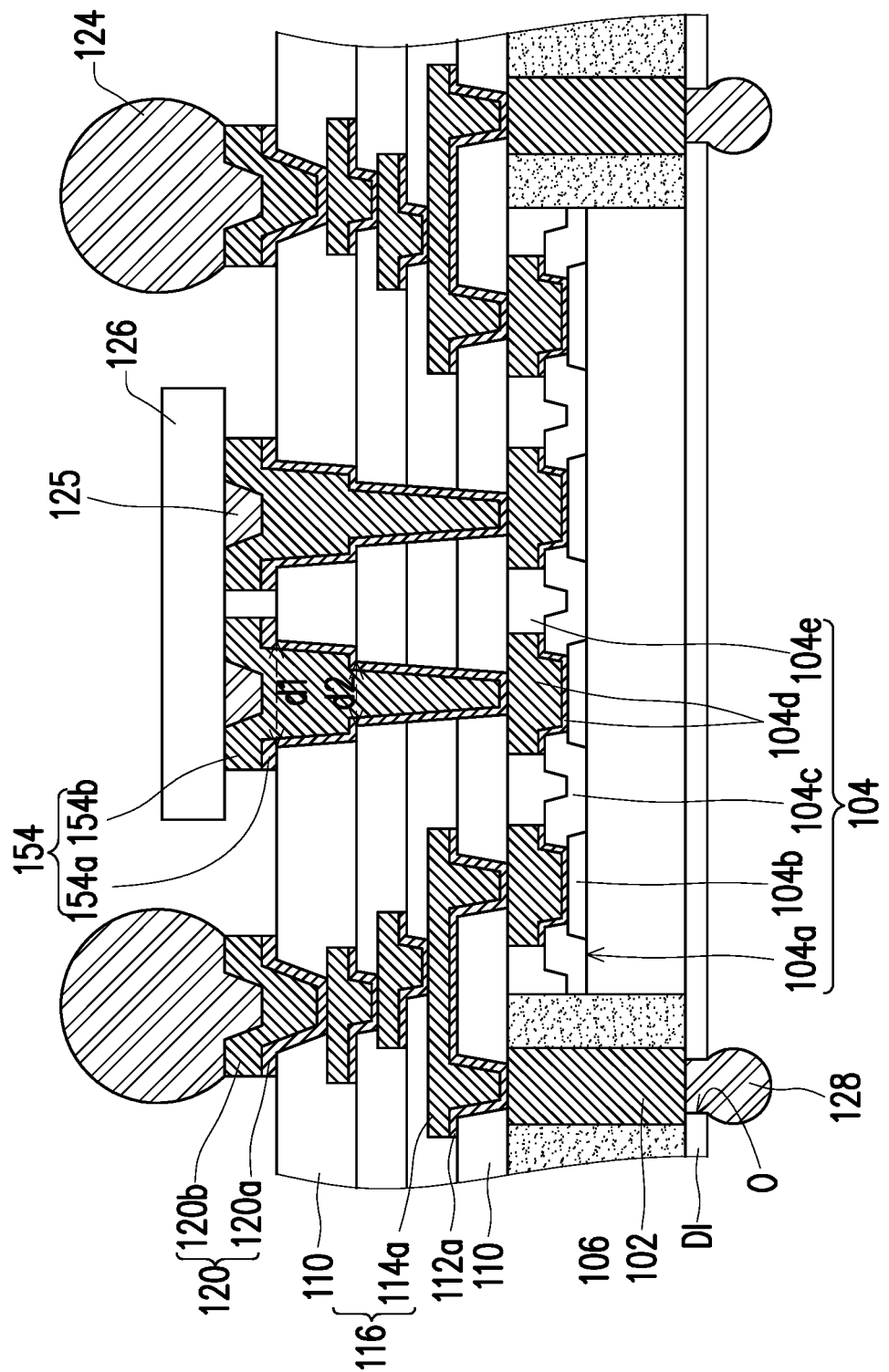

FIGS. 5A-5C are schematic cross-sectional views illustrating a manufacturing process of a semiconductor package in accordance with some embodiments of the disclosure. The steps of FIGS. 5A-5C follow the procedures of FIG. 1C, in other words, the step of FIG. 5A is continuously performed after the step of FIG. 1C. The elements similar to or substantially the same as the elements described previously will use the same reference numbers, and certain details or descriptions of the same elements may not be repeated herein. Referring to FIG. 5A, an inter-dielectric layer 110 (i.e., the topmost inter-dielectric layer 110) is formed over the die 104 and the encapsulant 106, and a plurality of contact openings 110c and a plurality of via holes 150 are formed in the inter-dielectric layer 110 to expose the underlying redistribution conductive patterns 116 and the underlying inter-dielectric layer 110 respectively. In some embodiments, a mask HM is conformally formed over the topmost inter-dielectric layer 110. The mask HM is patterned to have a plurality of openings OP in the via holes 150, and the openings OP expose portions of the underlying inter-dielectric layer 110. In some embodiments, the via hole 150 has a diameter d1, and the opening OP has a diameter d2 smaller than the diameter d1.

Referring to FIG. 5B, by using the mask HM as a mask, a plurality of via holes 152 are formed in the inter-dielectric layers 110, so as to expose the conductive pillars 104d of the die 104. In some embodiments, the via holes 152 are formed by removing portions of the inter-dielectric layers 110 exposed by the openings OP of the mask M. A plurality of via holes 148 are formed by the via holes 150 (i.e., an upper via hole) and the via holes 152 (i.e., a lower via hole) connected to the via holes 150, for example. In other words, the via hole 148 is formed by two steps, which are a step of forming the via hole 150 and a step of forming the via hole 152. In some embodiments, the via hole 150 has a diameter d1, and the via hole 152 has a diameter d2 smaller than the diameter d1. In some embodiments, a part of the via hole 148, that is, the via hole 150, is formed simultaneously with the contact openings 110c by using the same mask, and thus additional mask for the via hole 150 may be omitted. In some embodiments, the via hole 150 is formed by penetrating through one inter-dielectric layer 110, and the via hole 152 is formed by penetrating through at least two inter-dielectric layers 110, for example. However, the disclosure is not limited thereto. In some alternative embodiments, the via hole 150 may penetrate through at least two inter-dielectric layers 110, for example.

Referring to FIG. 5C, the mask HM is removed. Then, a plurality of UBM patterns 120 are formed in the contact opening 110c of the topmost inter-dielectric layer 110 to electrically connect the redistribution conductive patterns 116. A plurality of vias 154 are formed in the via holes 148 to electrically connect the conductive pillar 104d of the die 104. In some embodiments, the via 154 is continuously and integrally formed by one filling process. In some embodiments, the via 154 has at least two different diameters (such as the diameters d1, d2). In some embodiments, the UBM patterns 120 and the multi-step shaped vias 154 respectively include a seed layer pattern 120a, 154a and a conductive pattern 120b, 154b, for example. A plurality of conductive terminals 124 are placed on the UBM patterns 120, and a plurality of passive components 126 are mounted on the vias 154. Then, the dielectric layer DI is separated from the carrier C, and a plurality of contact openings O is formed in the dielectric layer DI to partially expose the conductive posts 102. After that, a plurality of conductive terminals 128 are placed in the contact openings O, and the conductive terminals 128 are electrically connected to the conductive posts 102.

In the package, the vias (i.e., staggered vias) may be stacked one another in the plurality of inter-dielectric layers to electrically connect the die. However, weak points such as voids and cracks may be formed inside the staggered vias and bird's beak may be formed at the interfaces of the staggered vias after reliability test, which causes the residual stress and delamination. Accordingly, reliability failure is increased. In addition, the staggered vias causes poor thermal dissipation, more delay and less efficiency due to the staggered routing path and the interface contact resistance. Furthermore, profile distortion of the staggered vias due to the dielectric shrinkage and overlay issue may occur. In some embodiments, one via (i.e., the deep via) penetrates from the topmost inter-dielectric layer to the bottommost inter-dielectric layer, that is, one high aspect ratio via is formed in a plurality of inter-dielectric layers to directly connect the die. Since the deep via is continuously and integrally formed by one filling process, the issues caused by the staggered vias may be prevented, and mechanical and electrical properties such as structure strength, reliability, thermal dissipation, delay, efficiency and via profile may be significantly improved. In addition, in some embodiments, etch stop rings are used to form an improved via profile. Furthermore, the deep via may be also applied on multiple system on chip (SoC) combination such as multi-chip module (MCM), stacked 3DICs with conductive posts, 3D integrated CMOS image sensor (CIS) device, integrated optical component, and so on.

In accordance with some embodiments of the present disclosure, a semiconductor package includes a die, a plurality of dielectric layers, a plurality of redistribution patterns and a via. The dielectric layers are sequentially stacked over the die. The redistribution patterns are disposed in the dielectric layers. The via is integrally formed, penetrates through the plurality of dielectric layers and is in contact with the die.

In accordance with alternative embodiments of the present disclosure, a semiconductor package includes a die, a multi-step shaped via and a plurality of rings. The multi-step shaped via is disposed over and electrically connected to the die. The rings surround and are in contact with the multi-step shaped via respectively.

In accordance with yet alternative embodiments of the present disclosure, a method of manufacturing a semiconductor package includes the following steps. A first dielectric layer is formed over a die. A first ring is formed on the first dielectric layer. A second dielectric layer is formed on the first dielectric layer to cover the first ring. By using the first ring as an etch stop layer, a portion of the second dielectric layer is removed to form a first via hole exposing a portion of the first ring, wherein a diameter of the first via hole is larger than an inner diameter of the first ring. By using the first ring as a mask, portions of the first and second dielectric layers are removed to form a second via hole connecting the first via hole, wherein a diameter of the second via hole is substantially equal to the inner diameter of the first ring. A via is formed in the first and second via holes to electrically connect to the die.

In accordance with yet alternative embodiments of the present disclosure, a semiconductor device includes a die, a plurality of dielectric layers over the die, a via and at least one ring. The dielectric layers include a plurality of first surfaces facing the die. The via penetrates through the plurality of dielectric layers and includes at least one second surface facing the die. The ring surrounds the via and is disposed in at least one of the plurality of dielectric layers. The ring includes a third surface facing the die, wherein the third surface of the at least one ring is inserted between the at least one second surface of the via and the first surface of the at least one of the plurality of dielectric layers.

In accordance with yet alternative embodiments of the present disclosure, a semiconductor device includes a plurality of dielectric layers, a via and a plurality of rings. The via is disposed in the plurality of dielectric layers and includes a plurality of steps. The rings are respectively disposed on the plurality of dielectric layers, and surround the via respectively. A distance between a surface of one of the plurality of steps of the via and a surface of one of the dielectric layers is substantially the same as a height of the corresponding ring.

In accordance with yet alternative embodiments of the present disclosure, a method of manufacturing a semiconductor device includes the following steps. A first ring is formed on a first dielectric layer. A second dielectric layer is formed on the first dielectric layer to cover the first ring, wherein a bottom surface of the first ring is substantially coplanar with a bottom surface of the second dielectric layer. By using the first ring as an etch stop layer, a portion of the second dielectric layer is removed to form a first via hole exposing a portion of the first ring, wherein a diameter of the first via hole is larger than an inner diameter of the first ring. By using the first ring as a mask, portions of the first and second dielectric layers are removed to form a second via hole connecting the first via hole, wherein a diameter of the second via hole is substantially equal to the inner diameter of the first ring. A via is formed in the first and second via holes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a die;
   a plurality of dielectric layers over the die, comprising a plurality of first surfaces facing the die;
   a via, penetrating through the plurality of dielectric layers, and comprising at least one second surface facing the die; and
   at least one ring, surrounding the via and in at least one of the plurality of dielectric layers, and comprising a third surface facing the die, a fourth surface opposite to the third surface, and side surfaces, wherein the fourth surface is a planar surface and directly connecting to the third surface through the side surfaces at two ends of the fourth surface,
   wherein the fourth surface of the at least one ring is coplanar with the at least one second surface of the via.

2. The semiconductor device of claim 1, wherein the at least one ring is in direct contact with the at least one second surface of the via and a sidewall of the via.

3. The semiconductor device of claim 1, wherein the at least one ring is in direct contact with the first surface of the at least one of the plurality of dielectric layers.

4. The semiconductor device of claim 1, wherein the third surface is substantially coplanar with the first surface of the at least one of the plurality of dielectric layers, and the fourth surface is substantially coplanar with the at least one second surface of the via.

5. The semiconductor device of claim 4 further comprising a conductive pattern aside the at least one ring in the at least one of the plurality of dielectric layers, the conductive pattern having a fifth surface and a sixth surface opposite to the fifth surface, wherein the third surface of the at least one ring is substantially coplanar with the fifth surface of the conductive pattern, and the fourth surface of the at least one ring is substantially coplanar with the sixth surface of the conductive pattern.

6. The semiconductor device of claim 1, wherein the via includes a first diameter in the topmost one of the plurality of dielectric layers, and a second diameter smaller than the first diameter in the others of the plurality of dielectric layers.

7. The semiconductor device of claim 1, wherein the at least one ring includes a plurality of rings, and inner diameters of the plurality of rings are increasing as vertical distances between the plurality of rings and the die are increasing.

8. The semiconductor device of claim 1, wherein a material of the at least one ring comprises a non-conductive material.

9. A semiconductor device, comprising:
    a plurality of dielectric layers;
    a via in the plurality of dielectric layers, comprising a plurality of steps; and
    a plurality of rings, respectively disposed on the plurality of dielectric layers, and surrounding the via respectively, wherein a bottom surface of the via is coplanar with a top surface of at least one of the plurality of rings, and the top surface of the at least one of the plurality of rings is entirely planar.

10. The semiconductor device of claim 9, wherein the plurality of steps are in contact with the plurality of rings respectively.

11. The semiconductor device of claim 9, wherein outer peripheries of the plurality of rings are aligned with one another.

12. The semiconductor device of claim 9, wherein inner peripheries of the plurality of rings are in direct contact with sidewalls of the via respectively.

13. The semiconductor device of claim 9, wherein the via has a plurality of diameters defined by inner diameters of the plurality of rings.

14. The semiconductor device of claim 9, wherein one of the plurality of rings comprises a seed layer and a conductive layer on the seed layer.

15. A method of manufacturing a semiconductor device, comprising:
    forming a first ring on a first dielectric layer;
    forming a second dielectric layer on the first dielectric layer to cover the first ring, wherein a bottom surface of the first ring is substantially coplanar with a bottom surface of the second dielectric layer;
    forming a second ring on the second dielectric layer;
    by using the first ring and the second ring as a mask, simultaneously removing portions of the first and second dielectric layers to form a first via hole and a second via hole connecting the first via hole, wherein the second via hole has a greater diameter than the entire inner diameter of the first ring, and a diameter of the first via hole is substantially equal to the entire inner diameter of the first ring; and
    forming a via in the first and second via holes.

16. The method of claim 15, further comprising forming a conductive pattern on the first dielectric layer, wherein the first ring and the conductive pattern are formed simultaneously.

17. The method of claim 15, further comprising:
    forming a third dielectric layer on the second dielectric layer to cover the second ring;
    forming a third ring on the third dielectric layer;
    by using the first, second and third rings as the mask, simultaneously removing the portions of the first and second dielectric layers and a portion of third dielectric layers to form the first and second via holes and a third via hole connecting the first and second via holes; and
    forming the via in the first to third via holes.

18. The method of claim 15, wherein an outer periphery of the first ring is aligned with an outer periphery of the second ring.

19. The method of claim 15, wherein an inner diameter of the second ring is larger than the inner diameter of the first ring.

20. The semiconductor device of claim 1, wherein the at least one ring has a constant inner diameter.

* * * * *